United States Patent
Jain (10) Patent No.: US 8,124,511 B2
(45) Date of Patent: Feb. 28, 2012

(54) METHOD OF MANUFACTURING A SEMICONDUCTOR DEVICE HAVING REDUCED N/P OR P/N JUNCTION CRYSTAL DISORDER

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 173 days.

(21) Appl. No.: 11/951,448

(22) Filed: Dec. 6, 2007

(65) Prior Publication Data

US 2008/0145992 A1 Jun. 19, 2008

Related U.S. Application Data

(60) Provisional application No. 60/870,495, filed on Dec. 18, 2006.

(51) Int. Cl.
*H01L 21/425* (2006.01)
(52) U.S. Cl. ............ 438/528; 438/305; 257/E21.135
(58) Field of Classification Search .......... 438/302, 438/303, 305, 528; 257/E21.135
See application file for complete search history.

(56) References Cited

U.S. PATENT DOCUMENTS

| | | | |
|---|---|---|---|
| 6,521,502 B1 * | 2/2003 | Yu ................................ | 438/305 |
| 6,548,361 B1 * | 4/2003 | En et al. ...................... | 438/301 |
| 2007/0148888 A1 * | 6/2007 | Krull et al. .................. | 438/306 |

* cited by examiner

*Primary Examiner* — Thanhha Pham
(74) *Attorney, Agent, or Firm* — Jacqueline J. Garner; Wade J. Brady, III; Frederick J. Telecky, Jr.

(57) ABSTRACT

One aspect provides a method of manufacturing a semiconductor device having reduced N/P or P/N junction crystal disorder. In one aspect, this improvement is achieved by forming gate electrodes over a semiconductor substrate, amorphizing the semiconductor substrate that creates amorphous regions adjacent the gate electrodes to a depth in the semiconductor substrate. Source/drains are formed adjacent the gate electrodes by placing conductive dopants in the semiconductor substrate, wherein displaced substrate atoms and the conductive dopants are contained within the depth of the amorphous regions. The semiconductor substrate is annealed to re-crystallize the amorphous regions subsequent to forming the source/drains.

23 Claims, 6 Drawing Sheets

METHOD OF MANUFACTURING A SEMICONDUCTOR DEVICE HAVING REDUCED N/P OR P/N JUNCTION CRYSTAL DISORDER

CROSS-REFERENCE TO PROVISIONAL APPLICATION

This application claims the benefit of U.S. Provisional Application No. 60/870,495 entitled "Method of Producing N/P or P/N Junctions with Reduced Crystal Disorder" to Amitabh Jain, filed on Dec. 18, 2006 which is commonly assigned with the present invention and incorporated herein by reference as if reproduced herein in its entirety.

TECHNICAL FIELD

The invention is directed, in general, to a method of manufacturing a semiconductor device, and more specifically, to a method of manufacturing a semiconductor device having reduced N/P or P/N junction crystal disorder.

BACKGROUND

Sub-micron sized transistors are very well known and are used extensively in all types of electrical devices. It is also well known that these transistors often include deep source/drains and shallower source/drains, that are located adjacent the gate electrodes of the transistors and between which a channel region is formed during an applied voltage. The shallow source/drains are typically formed by placing dopants into a semiconductor substrate through well-known processes, such an implantation. The shallow source/drains are implanted immediately adjacent the gate electrodes. Typically, after sidewall spacer formation, deep source/drain implants are conducted to complete the implantation of process for the source/drains.

The dopant profile of both the shallow source/drains and the deep source/drains determine channel length and govern the electrical characteristics of the electronics device in which they are incorporated. As such, manufacturers take great care in making certain that the dopant profiles are as close to specification parameters as possible. To that end, implantation, dosages, implantation energies, and subsequent activation processes are carefully calculated and followed to make certain that the dopant profiles are within specified parameters.

The implantation process can amorphize the substrate by breaking up the crystalline structure of the doped substrate due to the energy imparted by the doping atoms. Typically, the depth of the amorphization is about equivalent to the depth to which the dopants are implanted. Subsequent to the implantation of both the shallow source/drains and the deep source/drains, an anneal is conducted to repair the crystalline structure to the depth of the amorphized doped substrate.

However, during the implantation process, some silicon atoms can be displaced to a depth beyond the amorphous layer. As a result, these displaced silicon atoms are not repaired or placed back into the crystal lattice by the anneal and remain as interstitials, recoils, or dislocation loops.

SUMMARY

One embodiment provides a method of manufacturing a semiconductor device. The method, in this embodiment, comprises forming gate electrodes over a semiconductor substrate comprising silicon and amorphizing a semiconductor substrate with a neutral species. The amorphizing creates amorphous regions adjacent the gate electrodes having a first depth in the semiconductor substrate. Shallow source/drains are formed adjacent the gate electrodes by placing conductive dopants in the semiconductor substrate to a second depth less than the first depth such that displaced silicon atoms and the conductive dopants are substantially contained within the first depth. The method further includes forming sidewall spacers adjacent the gate electrodes and forming deep source/drains adjacent the gate electrodes. A first anneal is conducted subsequent to forming the deep source drains, and a second anneal is conducted subsequent to the first anneal, wherein the first and second anneals re-crystallize the amorphous regions.

Another embodiment provides a method of manufacturing a semiconductor device that comprises forming gate electrodes over a semiconductor substrate, amorphizing a semiconductor substrate that creates amorphous regions adjacent the gate electrodes to a depth in the semiconductor substrate. Source/drains are formed adjacent the gate electrodes by placing conductive dopants in the semiconductor substrate, wherein displaced substrate atoms and the conductive dopants are substantially contained within the depth of the amorphous regions. The semiconductor substrate is annealed to re-crystallize the amorphous regions subsequent to forming the source/drains.

BRIEF DESCRIPTION OF DRAWINGS

The disclosure is described with reference to example embodiments and to accompanying drawings, wherein.

DETAILED DESCRIPTION

Problems arise from the occurrence of displaced substrate atoms, which may referred to as interstitial silicon atoms, recoils, or dislocation loops, that occur during a doping process to form source/drains. As each dopant atom penetrates the substrate, it undergoes a series of collisions displacing the substrate atoms along the way. Both the doping atoms and dislodged substrate atoms can continue and cause further damage, and so the energy spreads over many moving particles. Eventually, the energy per particle becomes too small and the cascade stops. Hence, after many ions have been implanted, an initially crystalline target will be so perturbed that it will have changed to a highly disordered or amorphous state, which forms an amorphous region in the substrate.

However, in many instances, the doping atoms displace or move some of the substrate atoms to layers underlying the amorphous region. The invention addresses this problem by providing ways to contain the displaced atoms within an amorphized region. Displaced substrate atoms, for example, silicon atoms, are atoms that are moved from their positions within the substrate as the result of the doping process. This includes interstitial atoms that are moved from their positions within a crystal lattice such that they are located between lattice atoms and not on a lattice site.

Typical implantation processes displace substrate atoms beyond the amorphized region, and because they are so located, subsequent annealing does not repair these atoms or place them back into the crystal lattice. The existence of these lingering atoms is highly undesirable because they can increase dopant diffusion, which can change the intended dopant profile, and they also promote junction leakage.

Embodiments of the invention, which are presented herein, provides ways to extend the amorphous region such that displaced atoms are contained within the region without hindering the functionality of the intended dopant profile. This results in improved junction leakage with less unintended dopant diffusion when compared to devices manufactured using conventional processes.

The word "contained," as used herein, includes those situations where less than 100% of the displaced atoms, or a substantial portions of the atoms, are located within the amorphous region and allows for the instance where trace amounts (for example, less than about 1E17 atoms/cm$^3$ of displaced atoms may be beyond the amorphous region). However, this trace amount of uncontained atoms is not great enough to prevent an improvement in the device's junction leakage or reduce dopant diffusion within the device. Because the displaced atoms are substantially contained within the extended amorphous region, subsequent annealing processes substantially repair or place the atoms back into a crystal lattice. Thus, the junction leakage and dopant diffusion problems associated with conventional processes is improved.

Figure 1:
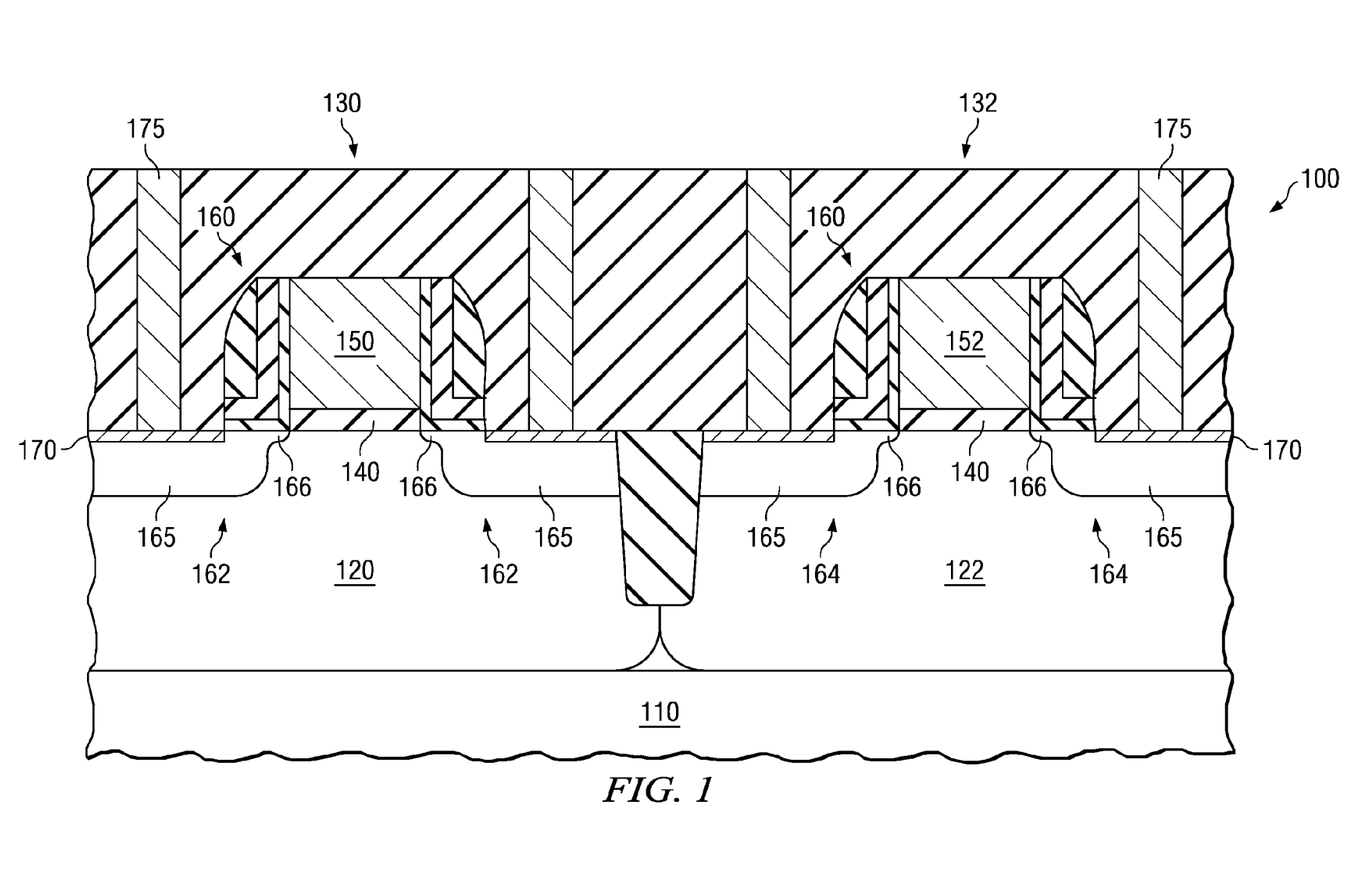
FIG. 1 illustrates a semiconductor device that can be made using the principles of the invention.

FIG. 1 illustrates a view of one embodiment of a semiconductor device 100 that may be made by the various embodiments of the invention. In this illustrated embodiment, the semiconductor device 100 is configured as a transistor, though other types of electronic devices may be constructed according to the embodiments described herein. The semiconductor device 100 includes a substrate 110. The substrate 110 may be any known semiconductor material, e.g., silicon, silicon-germanium, etc., and may be any layer deposited over a semiconductor wafer, such as an epitaxial layer or may be a doped region of a semiconductor wafer. Located within the substrate 110 are well regions 120, 122. In one embodiment, these wells may be the same, or in an alternative embodiment, they may be complementary wells; for example, well 120 may be a well for an NMOS device and well 122 may be a well for a PMOS device. Located over the substrate 110 and well regions 120, 122 are gate structures 130, 132, which in one embodiment, may be complementary devices; for example, gate structure 130 may be an NMOS device and gate structure 132 may be a PMOS device.

The gate structures 130, 132 illustrated in FIG. 1 each include a gate oxide 140 located over the substrate 110, as well as doped gate electrodes 150, 152 located over the gate oxide 140 and may have a variety of thicknesses, gate lengths, and gate widths. In one embodiment, the gate electrodes 150, 152 may comprise an appropriately doped polysilicon that can function as either an NMOS or PMOS device. For instance, the gate electrodes 150, 152 may include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so-called work function.

The gate structures 130, 132 may further include conventional gate sidewall spacers 160 flanking both sides of the gate electrodes 150, 152. The gate sidewall spacers 160 in the embodiment of FIG. 1 may each include one or more different layers. For instance, the gate sidewall spacers 160 may also include nitride spacers and sidewall oxides. The gate sidewall spacers 160 may comprise many different types of material and one or more layers.

The semiconductor device 100 illustrated in FIG. 1 additionally includes source/drains 162, 164 located within the substrate 110 and proximate the gate electrodes, 150, 152. The source/drains 162, 164 may include deep source/drains 165, and shallow source/drains 166 (which may be known as medium doped drains (MDD) or lightly doped drains (LDD)), both of which may be doped with a dopant to correspond to the type of device. For instance, source/drains 162, may be doped with an n-typed dopant, such as arsenic or phosphorous, while source/drains 164 may be doped with a p-type dopant, such as boron. The deep source/drains 165 are typically implanted more deeply and with a higher dosage than the shallow source/drains 166. Located within the source/drains 162, 164 are silicided source/drain contact pads 170, on which contact or interconnect structures 175 are located.

When formed in accordance with the invention, the device 100 has fewer dislocation loops or interstitials associated with its structure than devices made using conventional processes with the above-stated, attendant improvements.

Figure 2A:
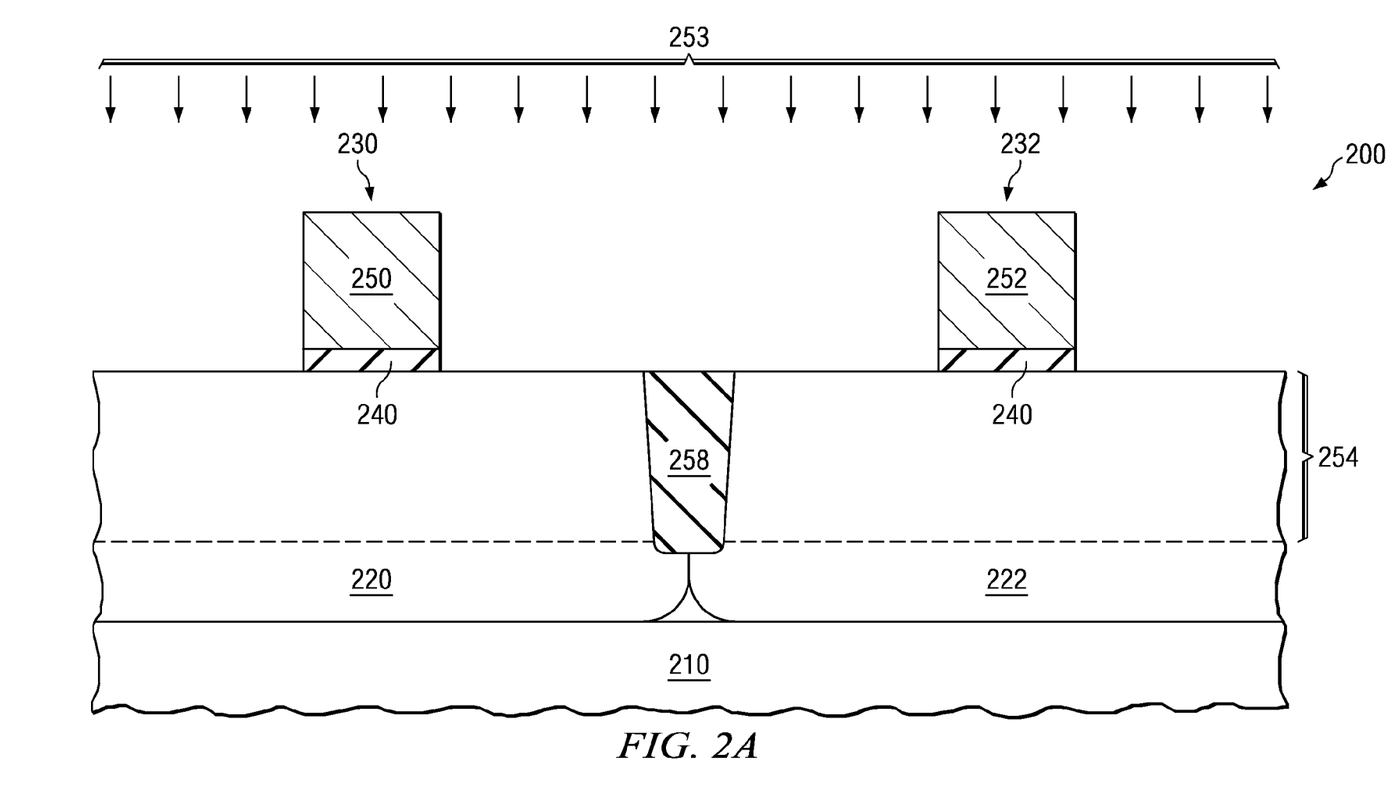
FIGS. 2A-2D illustrates selected steps of manufacturing the device of FIG. 1.

FIG. 2A illustrates a manufacturing step instructing how one might, in certain embodiments, manufacture the semiconductor device 100 depicted in FIG. 1. The semiconductor device 200 of FIG. 2A includes a substrate 210, as mentioned above. In the embodiment illustrated in FIG. 2A, the substrate 210 is a p-type substrate; however, one skilled in the art understands that the substrate 210 could be an n-type substrate. In such cases, each of the dopant types described throughout the remainder of this document would be reversed. For ease of discussion, no further reference to this opposite scheme will be discussed.

Located within the substrate 210 are conventionally doped wells 220, 222. In one doping scheme, the well region 220 may be doped with a p-type dopant, such as boron, to form the basis of an NMOS or n-channel device, while well region 222 may be doped with an n-type dopant, such as arsenic or phosphorous, to form the basis for a PMOS or p-channel device. Alternatively, the wells 220, 222 may be doped with the same dopant.

Located over the substrate 210 in the embodiment of FIG. 2A are gate structures 230, 232, which may be formed using conventional processes. In the illustrated embodiment, the gate structures 230, 232 each include a gate oxide 240 and gate electrodes 250, 252. The gate electrodes may be formed using materials, such as polysilicon, amorphous silicon, or metal, or various combinations of metals, or combinations of any of these materials. The gate oxide 240 may comprise a number of different materials and stay within the scope of the invention. For example, the gate oxide 240 may comprise silicon dioxide, or in an alternative embodiment comprise a high dielectric constant (K) material.

In one embodiment, following the formation of the gate electrodes 250, 252 and gate oxides 240, the device 200 is subjected to an amorphization process 253. In one aspect, the amorphization process 253 may be conducted using a neutral species, which may be either individual atoms or molecules of elements of materials, such as carbon, germanium, silicon, tin, argon, helium, neon, krypton, xenon, fluorine or combinations thereof. The neutral species do not substantially affect or change the conductive properties of the substrate, and thus, are well suited for the processes discussed herein. Conventional implantation processes may be used to implant the neutral species into the substrate 210. However, in one embodiment, the neutral species is implanted using a molecular implantation process.

In one particular embodiment, the selected neutral species is carbon, and the amorphization may be conducted using either atomic carbon (individual atoms) or carbon molecules that include at least 7 carbon atoms. In another aspect, the dose of the molecular carbon may range from about 1E14 atoms/cm$^2$ to about 1E16 atoms/cm$^2$ and may be implanted at a power of about 10 keV/carbon atom. Other dosages and powers may be used provided that the damage rate of the crystalline structure exceeds its recombination or self-repairing rate. While smaller molecules of 3 or 4 atoms are also applicable, larger molecules provide a more efficient amorphization of the substrate 210. One plausible reason is that atoms may move through the substrate in a denser pattern. As such, the efficiency of the amorphization is increased. It should also be understood that the size of the molecule, the dose, and power will depend on the type of neutral species that is used. Given the teachings herein, those skilled in the art would understand how to achieve the desired settings for different neutral species.

The amorphizing process 253 forms an amorphous region 254 in the wells 220, 222 of the substrate 210. The depth of the amorphous region (indicated by the bracket) will vary, depending on the device 200 and the implantation parameters that are used. However, its depth should be deeper than the shallow source/drains when present or deeper than the deepest portion of the source/drains. For example, the depth of the amorphous region 254 may be about 40 nm in a 32 nm technology, but it should be understood that this value will decrease as device sizes continue to decrease. Though the amorphous region 254 is shown as uniform, it should also be understood that the amorphous region 254 may vary in that more volume of the substrate 210 may be amorphized at its top than at its bottom. The bottom of the amorphous region occurs where the crystal disorder caused by the implantation is substantially reduced.

Figure 2B:
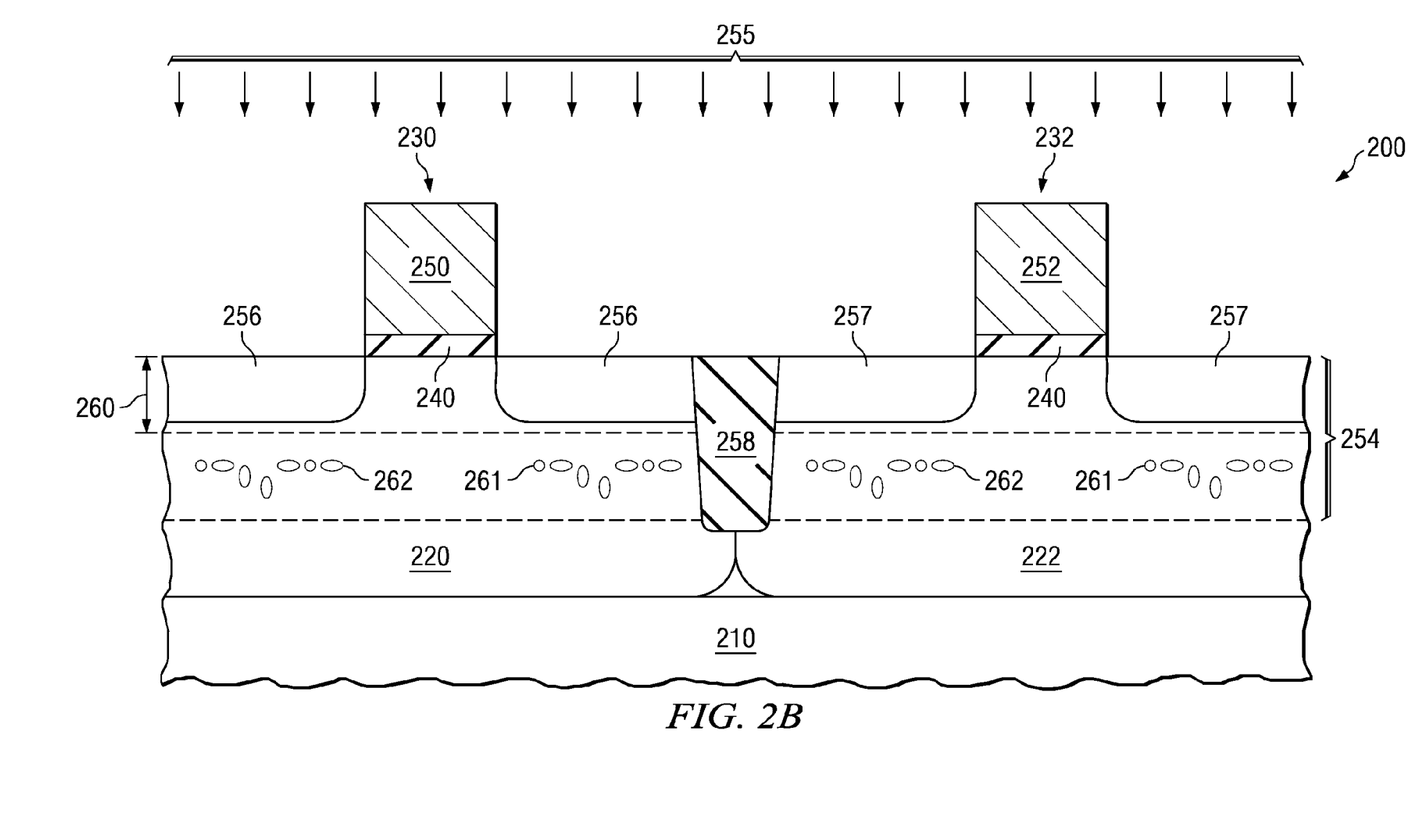

FIG. 2B shows an embodiment of the device 200 of FIG. 2A undergoing a doping process 255 to form shallow source/drains 256, 257, as those mentioned above. As used herein, the shallow source/drains 256, 257 are "formed" when the dopants are placed, for example, by implantation, into the wells 220, 222, and are considered formed even though the dopants may not be activated at this point. FIG. 2B shows both sides of the device 200 undergoing the same doping process 255. However, in other embodiments, where the device 200 is a complementary device, those skilled in the art would understand that masking steps would be conducted to separately implant respective NMOS and PMOS devices. Further, though shallow source/drains 256, 257 are discussed here, it should be understood that in certain embodiments, the shallow source/drains 256, 257 are optional and that the device 200 may include source/drains without the shallow source/drains 256, 257.

Conventional processes may be used to form the source/drains 256, 257 adjacent the gate electrodes 250, 252. As is standard in the industry, the shallow source/drains 256, 257 may have a dopant type opposite to that of the well regions 220, 222 in which they are located and are shallower and more lightly doped than later formed deep source/drains. An isolation structure 258, such as a conventional trench isolation structure, is located between the shallow source/drains 255, 256.

Conventional processes 255 may be conducted in a way to insure that the resulting doping profile meets specification parameters. Thus, the doping process 255 is conducted to place the dopants at the pre-activation depth 260, and as such, the dopants are substantially contained within the depth 260, except for trace or tail amounts of dopants 261 (represented by the white circles) that extend beyond depth 260. Further, any displaced substrate atoms 262 (represented by the black ovals) that are moved by the doping process 255 are substantially contained within the depth of the amorphized region 254. This embodiment provides the benefit of an amorphized region whose depth is sufficient to contain the displaced atoms 262 while using conventional processes to achieve a doping profile within specified parameters.

Another embodiment further includes reducing the temperature of the substrate 210 prior to or during the amorphizing. The temperature reduction may range from about −20° C. to about −196° C. and may be accomplished using liquid nitrogen to cool the substrate 210. The use of these low temperatures increases the efficiency of the amorphization process. These lower temperatures may be used in those embodiments where the neutral species is in either molecular or atomic form.

In another embodiment, the process of fabricating the device 200 may also include using an ion cluster beam to amorphize the substrate while implanting the dopants to form source/drains. The ion cluster beam may be used in combination with any of the other processes discussed herein or it may be used alone.

The ion cluster beam provides a controlled implant process that uses large number of individual atoms, e.g. 1000 atoms or greater, to penetrate and shatter the substrate with the doping atom. Due to the large number of atoms that are involved, the ion cluster beam does not penetrate deeply into the substrate 210 and does not produce recoils. Because of its controllability, amorphizing with a neutral species may not be necessary, although this embodiment does not exclude using the neutral species process. The use of the ion cluster beam to form source/drains may be used with various device sizes, but may be well suited for device sizes of 22 nm or less.

Following the formation of the shallow source/drains 256, 257, an anneal may be conducted. This anneal may be used to activate the dopants in the source/drains 256, 257 and re-crystallize the amorphous region 254. The anneal may be a laser anneal operated to heat targeted regions of the device 200 to temperatures ranging from about 1175° C. to about 1350° C. with dwell or residence times ranging from about 0.2 ms to about 0.8 ms. The laser is operated by mastering the laser across a wafer on which the device 200 is located such that the desired temperature and dwell times are achieved. The laser anneal provides the benefit of rapidly heating only those areas of the device 200 that require re-crystallization. Moreover, it is believed that re-crystallization is so rapid that a maximum number of atoms go into substitutional positions that sit on lattice sites, thereby avoiding interstitials. In an alternative embodiment, a flash anneal may be used in place of or in combination with the laser anneal.

The laser or flash anneal may be followed by a thermal anneal that includes annealing at temperatures ranging from about 850° C. to about 1150° C. In those embodiments where shallow source/drains 256, 257 are not present, any of the above discussed anneals, or a combination thereof, may be conducted following the implantation or formation of the source/drains. However, in those embodiments that include the shallow source/drains 256, 257, these anneals may be conducted at this point or at a later point in time and after the formation of deep source/drains, as discussed below.

Whenever conducted, the anneal(s) re-crystallize the amorphous region 254, which includes the displaced atoms. Since the displaced atoms 262 are contained within the amorphous regions 254, the re-crystallization removes or repairs the displaced atoms, which improves junction leakage and inhibits unwanted dopant diffusion.

Figure 2C:
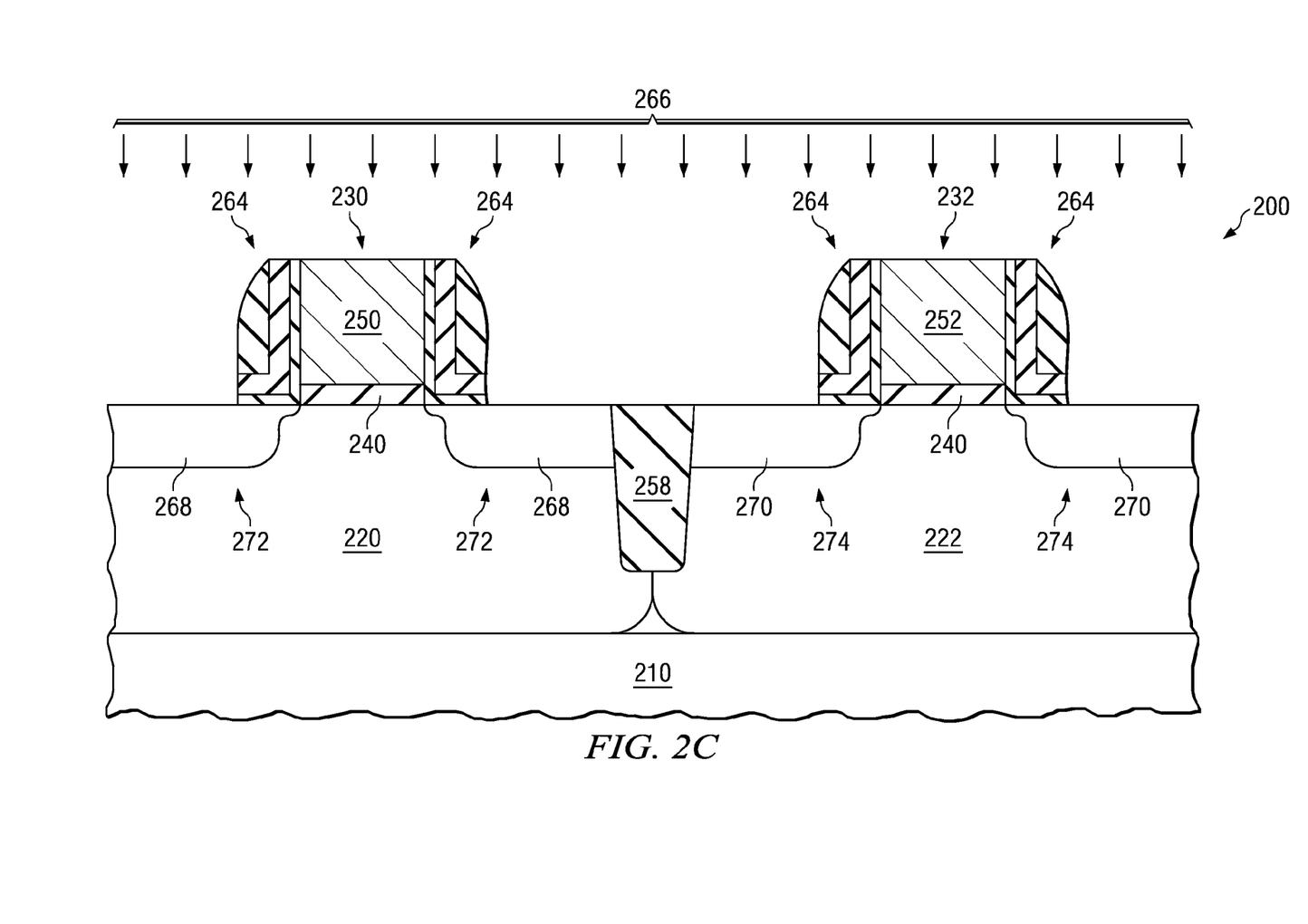

In FIG. 2C, there is shown the semiconductor device 200 of FIG. 2B after the formation of spacer layers 264. Conventional processes may be used to form the spacer layers 264.

FIG. 2C also shows the device 200 undergoing a deep source/drain implant 266 that forms deep source/drains 268, 270. Deep source/drain differ from the shallow source/drains 256, 257 (FIG. 2B) in that the dopant concentration and depth of the implant for the deep source/drain 268, 270 is typically greater than those used to form the shallow source/drains 268, 270. Conventional processes may be used to form deep source/drains 268, 270. In those embodiments that include shallow source/drains 256, 257, the deep source/drains 268, 270 and the shallow source/drains 256, 257 collectively form source/drains 272, 274. In other embodiments, however, the source/drains 272, 274 may consist of only the shallow or deep source/drains.

Figure 2D:
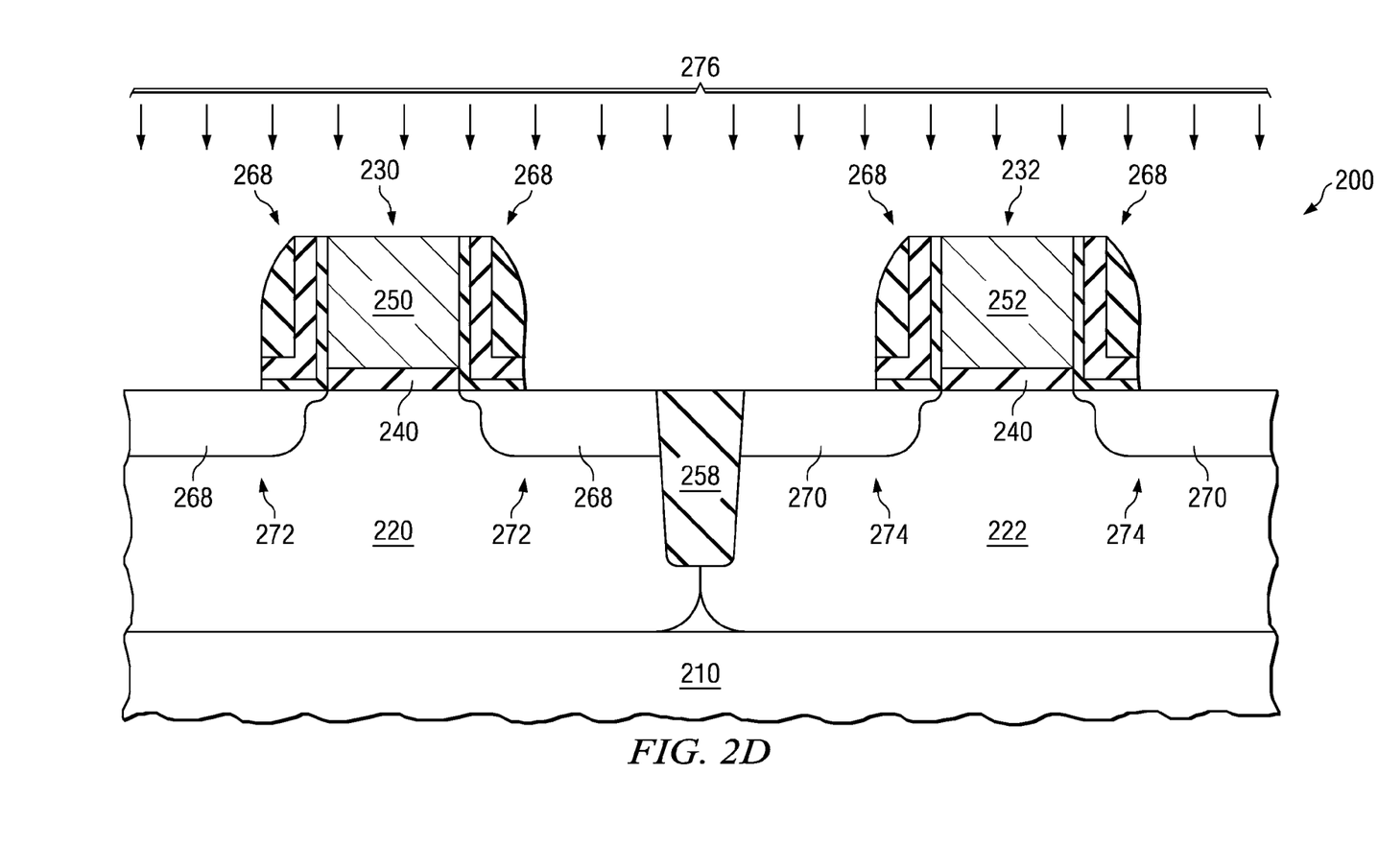

FIG. 2D shows the device 200 of FIG. 2C undergoing an anneal process 276, which may be either one or a combination of the previously discussed laser, flash, or thermal anneals. As mentioned above, the anneal 276 may be conducted after the formation of the source/drains 272, 274. The anneals may be used to not only re-crystallize the amorphous region but also activate the dopants in the source/drains 272, 274.

Figure 3:
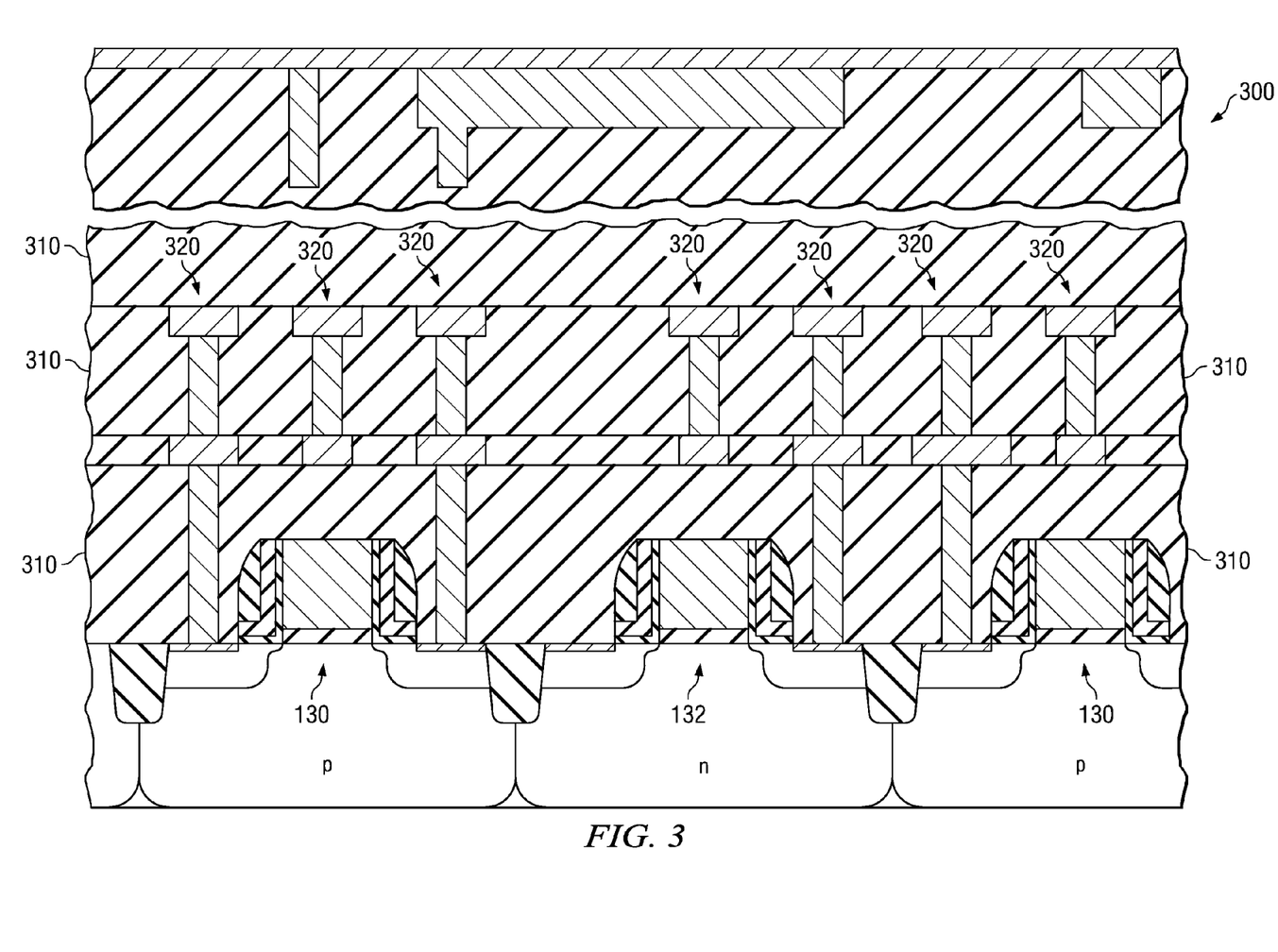
FIG. 3 illustrates a sectional view of an integrated circuit (IC) incorporating the semiconductor device of FIG. 1.

FIG. 3 illustrates the transistors 130, 132 of FIG. 1 incorporated into an integrated circuit (IC) 300. In the illustrated embodiments, the IC 300 includes complementary NMOS transistors 130 and PMOS transistor 132, which may be manufactured as discussed above. Overlying the transistors 130, 132 are dielectric layers 310 that may be conventionally formed, and interconnects 320 that are located over and within the dielectric layer 310. The interconnects 320 may be also be conventional and may include damascene or dual damascene structures, both of which are shown for illustrative purposes.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
    forming gate electrodes over a semiconductor substrate comprising silicon;
    amorphizing the semiconductor substrate with a neutral species, the amorphizing creating amorphous regions adjacent the gate electrodes having a first depth in the semiconductor substrate;
    forming shallow source/drains adjacent the gate electrodes by placing conductive dopants in the semiconductor substrate to a second depth less than the first depth, wherein displaced silicon atoms and the conductive dopants are substantially contained within the first depth such that only trace amounts less than 1E17 atoms/cm$^3$ of displaced atoms extend past the first depth;
    forming sidewall spacers adjacent the gate electrodes;
    forming deep source/drains adjacent the gate electrodes;
    conducting a first anneal subsequent to forming the deep source drains; and
    conducting a second anneal subsequent to the first anneal, wherein the first and second anneals re-crystallize the amorphous regions.

2. The method of claim 1, wherein amorphizing the semiconductor substrate with the neutral species includes amorphizing with carbon, germanium, silicon, tin, argon, helium, neon, krypton, xenon, fluorine or combinations thereof.

3. The method of claim 2, wherein amorphizing the semiconductor substrate with the neutral species includes amorphizing with atomic carbon.

4. The method of claim 2, wherein amorphizing with carbon, germanium, or silicon includes using molecular implantation to implant molecules of carbon, germanium, or silicon.

5. The method of claim 4, wherein amorphizing with carbon molecules includes using carbon molecules having at least 7 carbon atoms.

6. The method of claim 5 wherein amorphizing with carbon molecules having at least 7 carbon atoms includes using a dose ranging from about 1E14 atoms/cm$^2$ to about 1E16 atoms/cm$^2$ and at a power of about 10 keV/carbon atom.

7. The method of claim 4, further including reducing a temperature of the semiconductor substrate prior to or during the amorphizing.

8. The method of claim 7, wherein reducing the temperature includes reducing the temperature of the semiconductor substrate to a temperature ranging from about −20° C. to about −196° C.

9. The method of claim 1, wherein the semiconductor device is an integrated circuit and the method further includes:
    forming deep source/drains adjacent the gate electrodes;
    forming dielectric layers over the gate electrodes; and
    forming interconnects over and within the dielectric layers that interconnect the gate electrodes.

10. A method of manufacturing a semiconductor device, comprising:
    forming gate electrodes over a semiconductor substrate comprising silicon;
    amorphizing the semiconductor substrate with atomic carbon, the amorphizing creating amorphous regions adjacent the gate electrodes having a first depth in the semiconductor substrate;
    forming shallow source/drains adjacent the gate electrodes by placing conductive dopants in the semiconductor substrate to a second depth less than the first depth, wherein displaced silicon atoms and the conductive dopants are substantially contained within the first depth;
    forming sidewall spacers adjacent the gate electrodes;
    forming deep source/drains adjacent the gate electrodes;
    conducting a first anneal subsequent to forming the deep source drains;
    conducting a second anneal subsequent to the first anneal, wherein the first and second anneals re-crystallize the amorphous regions; and
    reducing a temperature of the semiconductor substrate prior to or during the amorphizing to a temperature ranging from about −20° C. to about −196° C.

11. A method of manufacturing a semiconductor device, comprising:
    forming gate electrodes over a semiconductor substrate;
    amorphizing a semiconductor substrate that creates amorphous regions adjacent the gate electrodes to a depth in the semiconductor substrate;
    forming source/drains adjacent the gate electrodes by placing conductive dopants in the semiconductor substrate, wherein displaced substrate atoms and the conductive dopants are substantially contained within the amorphous regions such that only trace amounts less than 1E17 atoms/cm$^3$ of displaced atoms extend past the amorphous regions; and
    annealing the semiconductor substrate to re-crystallize the amorphous regions subsequent to forming the source/drains.

12. The method of claim 11, wherein amorphizing the semiconductor substrate includes amorphizing with neutral species including carbon, germanium, silicon, tin, argon, helium, neon, krypton, xenon, fluorine or combinations thereof.

13. The method of claim 12, wherein amorphizing includes using molecular implantation to implant carbon, germanium, silicon, tin, or combinations thereof.

14. The method of claim 13, wherein amorphizing the semiconductor substrate with the neutral species includes amorphizing with atomic carbon.

15. The method of claim 14, further including reducing a temperature of the semiconductor substrate prior to or during the amorphizing to a temperature ranging from about −20° C. to about −196° C.

16. The method of claim 12, wherein amorphizing with carbon, germanium, or silicon includes using molecular implantation to implant molecules of carbon, germanium, or silicon.

17. The method of claim 16, wherein amorphizing with carbon molecules includes using carbon molecules having at least 7 carbon atoms.

18. The method of claim 17 wherein amorphizing with carbon molecules having at least 7 carbon atoms includes using a dose ranging from about 1E14 atoms/cm$^2$ to about 1E16 atoms/cm$^2$ and at a power of about 10 keV/carbon atom.

19. A method of manufacturing a semiconductor device, comprising:
    forming gate electrodes over a semiconductor substrate;
    amorphizinq a semiconductor substrate with neutral species including carbon, germanium, silicon, tin, argon, helium, neon, krypton, xenon, fluorine or combinations thereof that creates amorphous regions adjacent the gate electrodes to a depth in the semiconductor substrate, wherein amorphizing with carbon, germanium, or silicon includes using molecular implantation to implant molecules of carbon, germanium, or silicon;
    forming source/drains adjacent the gate electrodes by placing conductive dopants in the semiconductor substrate, wherein displaced substrate atoms and the conductive dopants are substantially contained within the amorphous regions;
    annealing the semiconductor substrate to re-crystallize the amorphous regions subsequent to forming the source/drains; and
    reducing a temperature of the semiconductor substrate prior to or during the amorphizing.

20. The method of claim 19, wherein reducing the temperature includes reducing the temperature of the semiconductor substrate to a temperature ranging from about −20° C. to about −196° C.

21. The method of claim 11, wherein forming source/drains includes:
    placing conductive dopants in the semiconductor substrate to form shallow source/drains such that the dopants are contained within the amorphized region; and
    placing dopants in the semiconductor substrate to form deep source/drains such that the dopants are contained within the amorphized region.

22. The method of claim 21, wherein the semiconductor device is an integrated circuit and the method further includes:
    forming dielectric layers over the gate electrodes; and
    forming interconnects over and within the dielectric layers that interconnect the gate electrodes.

23. The method of claim 11, wherein amorphizing and forming the source/drains includes using an ionized cluster beam or reducing the temperature of the semiconductor substrate to a temperature that ranges from about −20° C. to about −196° C., or combinations thereof.

* * * * *